Figure 1:
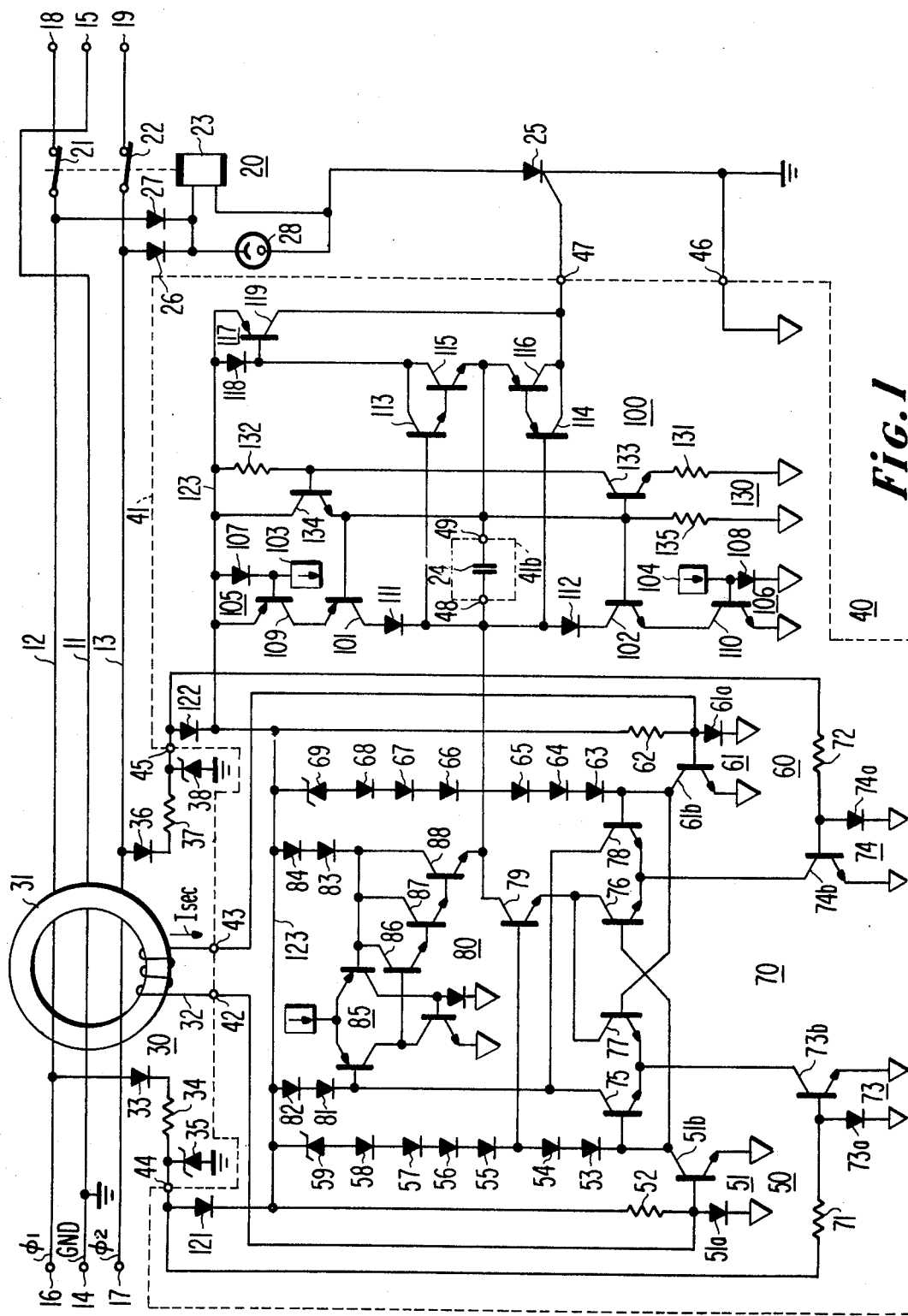

United States Patent [19]

Ahmed

[11] 4,037,155
[45] July 19, 1977

[54] CURRENT-RESPONSIVE THRESHOLD DETECTION CIRCUITRY

[75] Inventor: Adel Abdel Aziz Ahmed, Annandale, N.J.

[73] Assignee: RCA Corporation, New York, N.Y.

[21] Appl. No.: 560,721

[22] Filed: Mar. 21, 1975

Related U.S. Application Data

[62] Division of Ser. No. 461,268, April 15, 1974, Pat. No. 3,953,767.

[51] Int. Cl.² ............... G01R 19/16; G01R 31/02; G03K 5/20
[52] U.S. Cl. .................................. 324/133; 307/350; 324/51; 340/255
[58] Field of Search ............ 324/51, 133, 140; 307/235 R, 235 T, 288; 317/18 D, 31; 340/248 A, 248 B, 248 C, 253 A, 253 R, 255

[56] References Cited

U.S. PATENT DOCUMENTS

| 3,649,913 | 3/1972 | Flieder | 324/133 |
| 3,654,494 | 4/1972 | Bartlett et al. | 307/235 T |
| 3,723,814 | 3/1973 | Gross | 317/18 D |
| 3,769,577 | 10/1973 | Schnur et al. | 324/51 |
| 3,789,245 | 1/1974 | Schneider | 307/288 |
| 3,796,951 | 3/1974 | Joseph | 324/133 X |
| 3,852,642 | 12/1974 | Engel et al. | 317/18 D |
| 3,891,895 | 6/1975 | Wittlinger | 317/18 D |

Primary Examiner—Gerard R. Strecker
Attorney, Agent, or Firm—H. Christoffersen; S. Cohen; A. L. Limberg

[57] ABSTRACT

Threshold detection circuitry for providing an output current responsive to an input signal current, but only if it be of sufficient amplitude and persistence.

9 Claims, 3 Drawing Figures

CURRENT-RESPONSIVE THRESHOLD DETECTION CIRCUITRY

This divisional application is based on United States Patent Application Ser. No. 461,268 filed Apr. 15, 1974, now Pat. No. 3,953,767, in the name of A.A.A. Ahmed and entitled "GROUND FAULT DETECTION APPARATUS".

In ground fault detection apparatus, it is desirable to ascertain when synchronously detected ground fault currents exceed a predetermined level. The synchronously detected ground fault currents are accompanied by short-lived transients. Integration of the signal and its accompanying transients prior to threshold detection can provide an improved degree of immunity to false indications of dangerous ground fault current levels. This integration, if it be true integration as opposed to mere low-pass filtering, can also be used to obtain substantially increased sensitivity to ground fault currents.

The use of an integrator poses the problem of preventing protracted low-level noise or hum from being integrated to obtain signals of such high levels that the threshold detector circuitry is activated in response to them, resulting in a false indication that a dangerous level of ground fault current exists.

The present invention is embodied in threshold detection circuitry which is responsive to an input signal current to provide an output current, but only if the input signal current be of sufficient amplitude and persistence.

Figure 2:
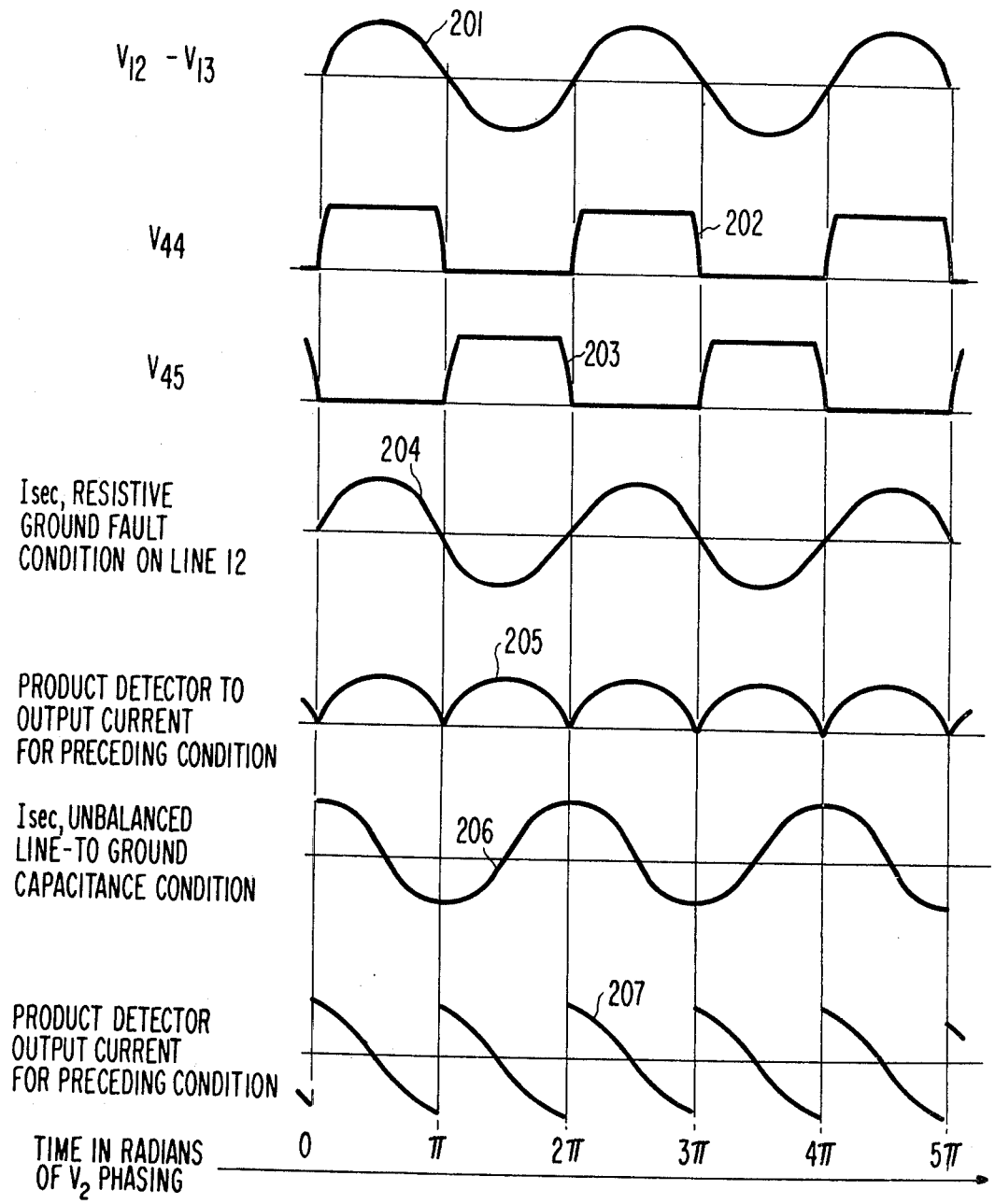
Figure 3:
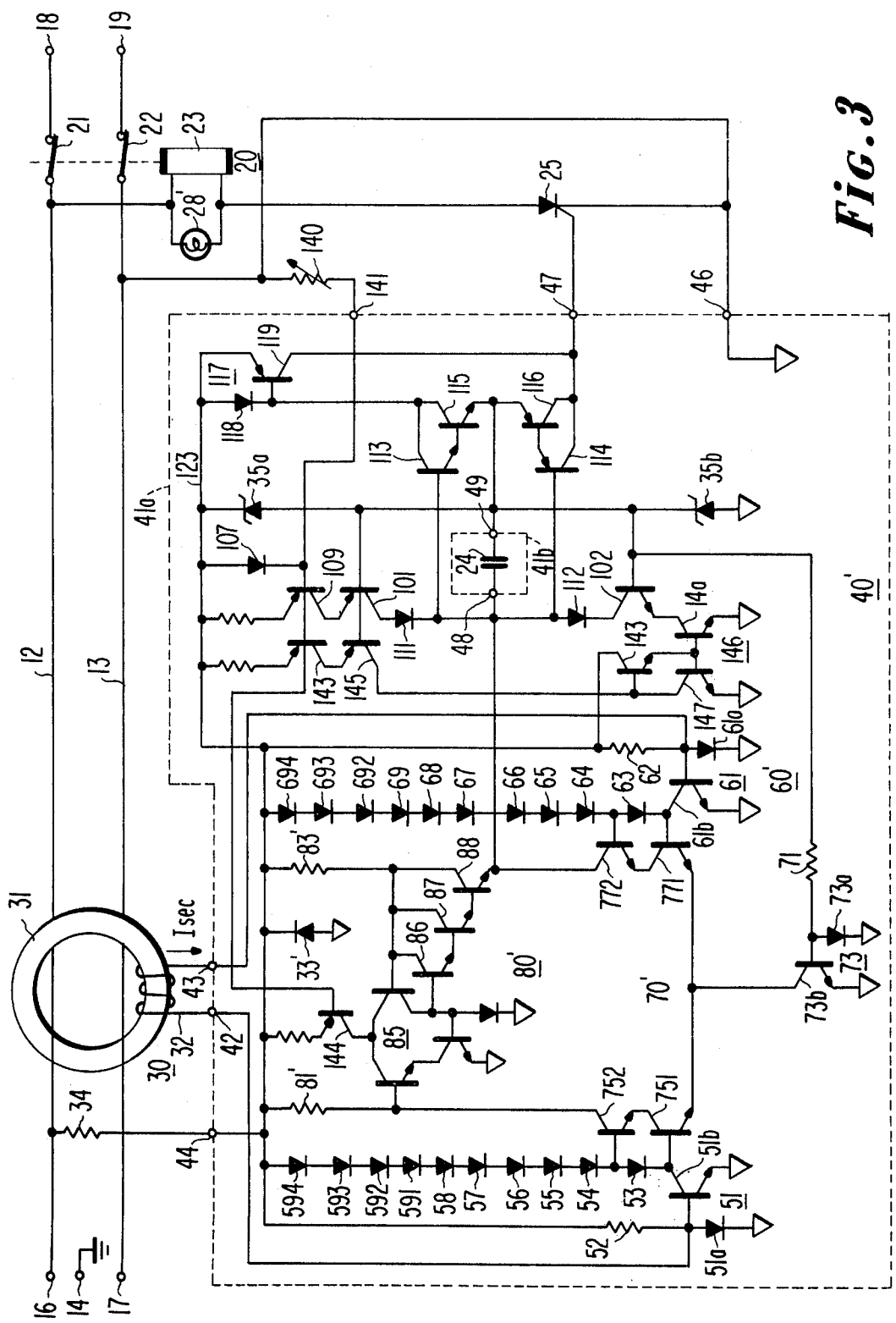

The nature of the invention will be better understood by reference to the drawing and the following detailed description thereof, together with the claims, in which drawing:

FIGS. 1 and 3 are schematic diagrams of threshold detection circuitry 100 and 100', respectively, each embodying the present invention as incorporated into one of two alternative ground-fault interrupter apparatuses; and FIG. 2 is a timing diagram useful in explaining the operation of the FIG. 1 apparatus.

FIG. 1 shows ground-fault interrupter apparatus 10 used with a-c power line conductors 11, 12 and 13. Line conductor 11 runs from terminal 14 to terminal 15 and is connected to power system ground. A-c power is applied between terminal 14 and each of the terminals 16 and 17 to which line conductors 12 and 13 are respectively connected. Terminals 18 and 19 are connected to line conductors 12 and 13, respectively. Terminals 18 and 19 together with terminal 15 are available for having a load or loads connected thereto. The ground fault interrupter apparatus 10 is set up for operation with conductors 11, 12 and 13 being connected in a 3-wire, neutral-ground system. In such system, the potentials applied to terminals 16 and 17, as referred to ground-neutral at terminal 14, are equal to each other in magnitude and are oppositely phased with respect to each other. This system is common in house-wiring, where 110 to 120 volt potentials are applied to each of the terminals 16 and 17. Loads may be connected between one of the line conductors 12, 13 and ground conductor 11. Or loads may be connected between line conductors 12 and 13.

A double-pole single-throw relay 20 has its poles 21 and 22 interposed in a-c power line conductors 12 and 13, respectively. Relay 20 operates to interrupt current flow through line conductors 12 and 13 whenever energizing current is applied to its energizing mechanism 23, here shown as an electromagnetic coil. The relay 20 is latched to maintain line conductors 12 and 13 non-conductive until it is reset.

Line conductors 11, 12 and 13 also function as the primary windings of a differential current transformer 30, being threaded through its toroidal core 31 (Other types of cores can also be used in a differential current transformer.) Differential current transformer 30 has a secondary winding 32 which will provide current to its load whenever the currents flowing to the load via line conductors 12 and 13 return to the source of a-c power by some route other than ground-neutral conductor 11.

The ground-fault detector module 40 included between the dotted outlines 41a, 41b may be built in a monolithic integrated circuit. The detector module 40 has terminals 42 and 43 connected to receive unbalance currents induced within the secondary winding 32 of differential current transformer 30. Detector module 40 has terminals 44 and 45 for receiving half-wave rectified and amplitude-limited a-c line potentials $V_{44}$ and $V_{45}$, respectively, from conductors 12 and 13, respectively. Terminal 46 of detector module 40 is connected to system ground to establish local ground. (Connections to this local ground are shown as small triangles.) Terminal 47 is the output terminal for module 40 used for supplying indications of the existence of a ground-fault as determined in response to the signals applied to terminals 42, 43, 44 and 45. Terminals 48 and 49 are for having a capacitor 24 external to the module 40 connected therebetween.

In general terms, the operation of the ground fault detector module 40 involves the following steps. The push-pull unbalance currents supplied to its terminals 42 and 43, respectively, are amplified in amplifiers 50 and 60, respectively; are then applied to a synchronous demodulator or product detector 70; and are subsequently multiplied together with push-pull currents responsive to the rectified and limited line potentials applied to terminals 44 and 45. The synchronous demodulator 70 provides push-pull product signals, one of which is inverted in the current inverting amplifier 80 and is then constructively combined with the other to provide a single-ended product signal for application to terminal 48.

Current inverting amplifier 80 has a high output impedance and current gain of −1. It is of a type fully described in the above identified parent application and in my U.S. Pat. application Ser. No. 461,229 filed Apr. 15, 1974; entitled "CURRENT AMPLIFIER" and assigned to a common assignee, RCA Corporation.

The single-ended product signal provided to terminal 48 by current inverting amplifier 80 is integrated by capacitor 24 to remove all its components except the substantially direct ones (sub-audio and direct components). When unbalance current is induced in secondary winding 32 by lines 12 and 13 exhibiting dissimilar capacitance-to-ground, it is in quadrature phasing with the fundamental frequency of the rectified and limited line potentials $V_{44}$ and $V_{45}$. This capacitative-unbalance line condition results in the single-ended product signal current applied to terminal 48 having substantially zero-valued direct component. When unbalance current is induced in secondary winding 32 by ground-fault from one of the lines 12 and 13 to system ground, it is in-phase or 180° out-of-phase with the fundamental frequency of $V_{44}$ and $V_{45}$. This ground-fault line condition results in the single-ended product signal current applied to terminal 48 having either a positive or a negative direct component. The synchronous demodulation of a signal responsive to ground-fault current carried out at line frequency by the product detector 70 can and does supplant the conventional step of rectification of such a signal. The synchronous demodulation step has the marked advantage over rectification that it provides discrimination against components of signal arising from line-to-ground capacitance conditions.

The integrated, single-ended product signal current at terminal 48 is applied to a novel current sensitive threshold detector 100, which senses when it exceeds a predetermined threshold value irrespective of polarity. Only when the direct component of the single-ended synchronous demodulator output is sufficiently large to exceed one of these thresholds, does the current sensitive threshold detector 100 supply via terminal 47 an indication of the presence of a resistive ground-fault. This indication is a positive current applied to trigger the semiconductor controlled rectifier (SCR) 25 into conduction. This completes a conductive path from whichever of the line conductors 12 and 13 is positive at that time through diode 26 or 27, respectively, thence through the magnetic or thermal heating coil of relay 23, and thence through the anode-to-cathode path of SCR 25. Current flow through this path energizes the coil 23 of relay 20 causing its poles 21 and 22 to be switched to disconnect terminals 16 and 17 from terminals 18 and 19, respectively. This interrupts current flow to the ground fault, which supposedly has occured further down the power line. Relay 20 latches to maintain non-conduction through line conductors 12 and 13 until such time as relay 20 is reset.

The SCR 25 continues to be conductive once it is triggered into conduction and thus completes an electrical latching circuit for the energizing coil 23 of relay 20. Resetting of this circuit is accomplished by interrupting the anode-to-cathode current flow of SCR 25. For instance, this may be done by shutting off a-c power to lines 12 and 13 for a brief period. Alternatively, or additionally, the latching of relay 20 may be by one of the conventional mechanical means in which case the relay 20 generally will be reset by hand. If mechanical latching is used, diodes 26 and 27 may be connected to lines 12 and 13 after the poles 21 and 22 of relay 20, so the energizing coil 23 of the tripped relay 20 does not continue to draw power.

The FIG. 1 circuitry has a number of novel aspects and will now be described in detail, beginning with a description of the manner in which operating potential is developed for powering the circuit module 40. Square wave potentials $V_{44}$ and $V_{45}$ appear at terminals 44 and 45, respectively, and have the waveforms 202 and 203, respectively, shown in the FIG. 2 timing diagram. $V_{44}$ and $V_{45}$ are developed, respectively, from the line-to-ground potential $V_{12}$ appearing on line conductor 12; and from the oppositely phased line-to-ground potential $V_{13}$ appearing on line conductor 13. $V_{12}$ has a waveform 201 as shown in the FIG. 2 timing diagram. During the negative excursions of $V_{12}$, diode 33 blocks current flow from terminal 44 to line conductor 12. Thus, terminal 44 is free to seek local ground potential (corresponding in the FIG. 1 configuration to ground neutral potential) by conduction through resistor 71 and diode 73a. During positive excursions of $V_{12}$, diode 33 is forward-biased, permitting current flow through itself and resistor 34 to terminal 44. This current flow raises the potential at terminal 44 towards $V_{12}$, to be constrained by the avalanche breakdown of avalanche doide 35. The breakdown of avalanche diode 35 occurs at a potential of 10–15 volts, which is much smaller than the 155–170 volt peak of $V_{12}$, so $V_{44}$ is substantially square in waveform, and is referred to herein as being a square wave. Resistor 34 is chosen to limit current flow through itself and diodes 33 and 35 during positive half-cycles of $V_{12}$ to a value somewhat larger than that required to supply detector module 40 and is used to keep the dissipation of power from diodes 33 and 35 within a tolerable limit.

$V_{45}$ is formed by rectifying and limiting $V_{13}$, oppositely phase to $V_{12}$, by means of elements 36, 37, 38 corresponding to elements 33, 34, 35, respectively, used for rectifying and limiting $V_{12}$ to form $V_{44}$. Therefore, like $V_{44}$, $V_{45}$ is a positive going square wave, but is shifted in timing therefrom by a half cycle ($\pi$ radians) of line frequency as waveforms 202 and 203 of the FIG. 2 timing diagram show. These alternately appearing square wave pulses in $V_{44}$ and $V_{45}$ are used for keying transistors 73b and 74b of synchronous demodulator 70 into alternating conduction as will be further explained hereinafter. Avalanche diodes 35 and 38 are shown as being external to the module 40, but may be included together therewith in an integrated circuit.

The positive excursions of the half-wave rectified and limited line potentials $V_{44}$ and $V_{45}$ applied to terminals 44 and 45, respectively, forward bias diodes 121 and 122, respectively, to be summed and thereby to appear on bus 123 as a full-wave rectified and limited line potential which will hereinafter be referred to as "B+ supply potential". Because of the avalanche diodes 35 and 38 each clip a positive excursion of a potential with 155–170 volt peak value whenever those excursions exceed some 10–15 volts, the potentials ($V_{44} + V_{45}$) on bus 123 is a fixed level direct potential except for a few degrees before and after each zero-crossing of line potentials $V_{12}$ and $V_{13}$. The potential ($V_{44} + V_{45}$) is therefore suitable, without need for smoothing by a filter capacitor, for use as a positive B-supply, or operating, potential for the transistor circuits in the detector module 40. The potential appearing on bus 123 will be referred to as B+ potential in the rest of this specification.

Terminal 49 is biased to a potential (1/2)B+, that is, to a potential one-half the B+ potential appearing on bus 123. This is done by means of a potential divider 130 of the type described in U.S. Pat. No. 3,383,612 (Reissue 27,454) originally issued May 14, 1968 to L. A. Harwood; entitled "Integrated Circuit Biasing Arrangements" and assigned, like the present application, to RCA Corporation. In this potential divider 130, resistive elements 131 and 132 have equal resistances. The transistor 133 is connected as a common-emitter amplifier, resistors 131 and 132, respectively, serving as its emitter degeneration resistor and its resistive collector load. The common-collector, emitter follower transistor 134 is connected to provide transistor 133 with direct coupled collector-to-base feedback for maintaining the potential at terminal 49 at the desired level. The resistance of resistor 135 is chosen sufficiently small to sink the collector current of transistor 109 applied to terminal 49 when transistor 101 is operated in saturation. This preserves the desired emitter follower action in transistor 134 for these operating conductions, which action may alternatively be preserved by using a shunt regulating transistor connected to maintain constant current flow through the collector-to-emitter path of transistor 134.

Secondary winding 32 of differential current transformer 30 is in effect presented with a short-circuit load impedance between terminals 42 and 43 of detector module 40 when $V_{44}$ and $V_{45}$ are at peak value. Then, diodes 51a and 61a are maintained strongly forward biased by similar-value quiescent biasing currents supplied to them via bleeder resistors 52 and 62, respectively. The quiescent offset potentials developed across diodes 51a and 61a are equal, permitting direct coupling of secondary winding 32 across terminals 42 and 43 without incurring direct current flow therethrough.

Diodes 51a and 61a are connected with transistors 51b and 61b, respectively, in current mirror amplifiers 51 and 61, respectively. The current gain of current mirror amplifier 51 is the ratio of the transconductance of transistor 51b divided by the conductance of diode 51a, which current gain can be accurately predetermined in an integrated circuit by the proportioning of areas of semiconductor junctions in devices 51a and 51b. The current gain of current mirror amplifier 61 is the ratio of the transconductance of transistor 61b divided by the conductance of diode 61a and is arranged to be equal to the current gain of current mirror amplifier 51. The collector currents of transistors 51b and 61b have equal quiescent components and exhibit push-pull variations proportionally responsive to unbalance current in the secondary winding 32. Push-pull signal potentials, six times as large as the sum of $I_{SEC}$ and the quiescent bias current as applied to diode 51a or 61a, respectively appear at the collector electrodes of transistors 51b and 61b.

Synchronous demodulator 70, shown in FIG. 1, is a double balanced synchronous detector—that is, a synchronous detector detector in which the signals being multiplied against each other are each balanced out from the current it supplies to terminal 48. The synchronous demodulator 70 comprises a pair of emitter-coupled differential amplifiers (the first with transistors 75 and 77 and the second with transistors 76 and 78), which are alternately keyed into conduction by application of current to the joined emitter electrodes of their transistors. The synchronous demodulator process as practiced in module 40 is wide-angle synchronous detection-—that is, the demodulating devices (transistors 75, 76, 77, 78) conduct over a large portion of each cycle of line frequency—so the conversion gain of synchronous demodulator 70 is relatively high compared to what it would be with narrow-angle synchronous detection.

The push-pull signal potential variations supplied from amplifiers 50 and 60 are applied between the base electrodes of emitter-coupled transistors 75 and 77 (or 76 and 78) to modulate their respective emitter currents. Since their applied base potentials exhibit push-pull variations, the joined emitter electrodes of transistors 75 and 77 (or 76 and 78) will be at a virtual ground for signal potential. The common-emitter amplifier operation of any of the transistors 75-78 can then be considered on a single-ended basis for signal. The signal potential variations occuring across diode 51a in response to $I_{SEC}$ as inverted and linearly amplified by amplifier 50, are in effect applied to the base-emitter junction of transistor 75 (or 76). The signal potential variations occurring across diodes 61a, in response to $I_{SEC}$, as inverted and linearly amplified by amplifier 60, are in effect applied to the base-emitter junction of transistor 77 (or 78).

For conditions where $I_{SEC}$ and current variations related thereto are small compared to the quiescent currents accompanying them (which is arranged to be the case for $I_{SEC}$ in the current range where ground-fault detection takes place and for small values of $I_{SEC}$), the collector currents of transistors 75, 76, 77 and 78 when they are keyed into conduction will be in accurately predetermined ratio with $I_{SEC}$. This may seem strange, for while the current mirror amplifiers 51 and 61 are known to be linear current amplifiers, the configuration provided by the diode chain collector loads of transistors 51b and 61b and an emitter-coupled transistor amplifier forms a configuration known to respond to an input signal current to provide an output signal current proportional to the input signal current raised to a power equal to the number of diodes in each chain. But, consider the binominal expansion, which describes a binominal term raised to a power $n$ as would be done in a configuration of the sort singled out for attention.

$$(1 \pm x)^n = 1 \pm nx + \frac{n(n-1)}{2} x^2 \pm \frac{n(n-1)(n-2)}{3} x^3 \pm \ldots$$

Where $x$ is small compared to 1, only the first two terms of the expansion are significant. Normalizing a quiescent current through the semiconductor junctions to unity value and expressing the signal current variations as $|x| < 1$, it is seen that the signal current is amplified in the singled-out configuration by the factor $n$ (which factor $n$ corresponds to the number of diodes in each chain 53–58 and 63–68).

Returning to consideration of the synchronous demodulator 70 per se, transistor 73b supplies collector current to the joined emitter electrodes of differential amplifier transistors 75 and 77 when and only when the square wave $V_{44}$ is of sufficient positive value to forward bias the base-emitter junction of transistor 73b and transistor 74b supplies collector current to the joined emitter electrodes of differential amplifier transistors 76 and 78 when and only when $V_{45}$ is of sufficient positive value to forward the base-emitter junction of transistor 74b.

Transistor 73b is connected together with diode 73a in a current mirror amplifier 73 having a current gain equal to the ratio of the transconductance of transistor 73b divided by the conductance of diode 73a. The current flow into the input port of current mirror amplifier 73 during peaks of $V_{44}$ is equal to $V_{44}$ minus the offset potential of forward biased diode 73a, all divided by the resistance of resistor 71. Elements 72, 73a and 74b have characteristics corresponding to those of elements 71, 73a and 73b, respectively; and the collector currents of transistors 73b and 74b are equal-amplitude square waves respectively recurring in alternate half-cycles of line frequency.

When transistor 73b withdraws current from the joined emitter electrodes of transistors 75 and 77 push-pull collector currents, each proportional to unbalance current in winding 32, flow from transistors 75 and 77. When transistor 74b withdraws current from the joined emitter electrodes of transistors 76 and 78, push-pull collector currents, each proportional to unbalance current in winding 32, flow from transistors 76 and 78. The collector current variations of transistors 75 and 78 are each proportional during alternative half cycles of line potentials $V_{12}$ and $V_{13}$, to the unbalance current in winding 32, but each in the opposite sense with respect to the other. The collector current variations of transistors 76 and 77 are each proportional during alternative half-cycles of line potentials $V_{12}$ and $V_{13}$, to the unbalance current in winding 32, but each in the opposite sense with respect to each other. The reason for these proportionalities has previously been explained. They arise from taking the sixth power of a large quiescent current accompanied by small current variations.

Referring to FIG. 2, when a resistive ground fault occurs in line conductor 12, a current $I_{SEC}$ as shown in waveform 204 flows in secondary winding 32. $I_{SEC}$ is in-phase with $V_{12}$. Waveform 205 shows the output current from the synchronous demodulator product detector 70 responsive to this phasing of $I_{SEC}$. Output current waveform 205 is developed as follows.

On positive excursions of $I_{SEC}$, the conduction of transistor 51b is decreased and the conduction of transistor 61a is increased. The increased collector potential of transistor 51b as compared to that of transistor 61b biases transistors 75 and 76 into increased conduction with respect to transistors 77 and 78. Positive excursions of $I_{SEC}$ for a resistive ground-fault on line conductor 12 correspond to positive excursions of $V_{44}$, so transistor 73b withdraws collector current from the joined emitter electrodes of transistors 75 and 77, while transistor 74b withdraws no collector current from the joined emitter electrodes of transistors 76 and 78. The collector current demand of transistor 75 is inverted by current mirror amplifier 80 to supply a like-valued positive current to terminal 48 which is substantially larger than the current withdrawn from terminal 48 via common-base amplifier transistor 79 to satisfy the collector current demand of transistor 77. Since transistors 76 and 78 have no emitter currents withdrawn from them, they have no collector currents demands to be coupled to terminal 48. A positive half-cycle of current is supplied to terminal 48 by product detector 70 during the positive excursion of the $I_{SEC}$ with waveform 204.

On negative excursions of $I_{SEC}$, the conduction of transistor 51b is increased and the conduction of transistor 61b is decreased. The increased collector potential of transistor 61b as compared to that of transistor 51b biases transistors 77 and 78 into increased conduction with respect to transistors 75 and 76. Negative excursions of $I_{SEC}$ for a resistive ground fault on line conductor 12 correspond in timing to positive excursions of $V_{45}$, and to nulls of $V_{44}$ so transistor 74b withdraws collector current from the joined emitter electrodes of transistors 76 and 78, while transistor 73b withdraws no collector current from the joined emitter electrodes of transistors 75 and 77. The collector current demand of transistor 78 is inverted by current mirror amplifier 80 to supply a like-value positive current to terminal 48 which is substantially larger than the current withdrawn from terminal 48 via common-base amplifier transistor 79 to satisfy the collector current demand of transistor 76. A positive half-cycle is supplied to terminal 48 during the negative excursion of $I_{SEC}$ with waveform 204.

The combined output currents from the synchronous demodulator 70 to terminal 48 are proportional to full-wave rectified $I_{SEC}$ for a resistive ground-fault condition on line conductor 12, which rectified current is shown as waveform 205 in the FIG. 2 timing diagram. This rectified current has a d-c component which, if it exceeds a certain threshold value of current absorbed by the current sensitive threshold detector 100, will charge the capacitor 24 to make terminal 48 positive with respect to terminal 49.

When a resistive ground-fault occurs in line conductor 13, an $I_{SEC}$ oppositely phased to waveform 204 will flow in the secondary winding 32 of the differential current transformer 30. Positive excursions of this oppositely-phased $I_{SEC}$ will cause increased conduction of transistor 51b and decreased conduction of transistor 61b. The increased collector potential of transistor 61b as compared to that of transistor 51b biases transistors 77 and 78 into increased conduction with respect to transistors 75 and 76. Positive excursions of $I_{SEC}$ for a resistive ground-fault on line conductor 13 correspond in timing to positive excursions of $V_{45}$ and to nulls of $V_{44}$, so transistor 73b withdraws current from the joined emitter electrodes of transistors 75 and 77, while transistor 74b withdraws no collector current from the joined emitter electrodes of transistors 76 and 78. The collector current demand of transistor 77 is coupled through the common-base amplifier transistor 79 to terminal 48 to supply it a negative half-cycle of current.

On negative excursions of $I_{SEC}$ for a resistive ground-fault on line conductor 13, the conduction of transistor 51b is decreased and the conduction of transistor 61b is increased. The increased collector potential of transistor 51b, as compared to that of transistor 61b, biases transistors 75 and 76 into increased conduction with respect to transistors 77 and 78. Negative excursions of $I_{SEC}$ for a resistive ground-fault on line conductor 13 correspond in timing to positive excursions of $V_{44}$ and to nulls of $V_{45}$, so transistor 73b withdraws collector current from the joined emitter electrodes of transistors 75 and 77, while transistor 74b withdraws no collector current from the joined emitter electrodes of transistors 76 and 78. The collector current demand of transistor 77 is coupled via the common-base amplifier transistor 79 to appear as a negative half-cycle of current flowing to terminal 48.

The current provided from the synchronous demodulator 70 to the terminal 48 for a resistive ground-fault appearing on line conductor 13 is a full-wave rectified, negative current similar in amplitude but oppositely poled to the current shown in waveform 205 of the timing diagram. This negative, full-wave rectified current has a d-c component which, if it exceeds a certain threshold value of current absorbed by the current sensitive threshold detector 100, will charge the capacitor 24 to make terminal 48 negative with respect to terminal 49.

Capacitor 24 integrates rapid current transients applied to it and this provides the ground fault detector module 40 considerable immunity against providing false indications of ground faults in response to switching transients on the line conductors 11, 12, 13. A design criterion meeting Underwriter's Laboratory requirements is to limit the peak current available from synchronous demodulator 70 beginning when a resistive ground fault draws more than 264 milliamperes from a line conductor. This is done by properly choosing the turns ratio of the differential current transformer 30 and the signal voltage gains of amplifiers 50 and 60. The peak current available from the synchronous demodulator 70 is determined by the potential drop (substantially equal to B+ supply potential) appearing across resistor 71 (or 72) divided by its resistance, as amplified by current mirror amplifier 73 (or 74). The capacitance of capacitor 24 is chosen so that 10 milliseconds are required for it to be charged to a level sufficient to cause the threshold switch 100 to trip the latching relay 20. This is normally adequate to discriminate against switching transients as they seldom exceed 2 milliseconds in duration.

The response of the synchronous demodulator 70 to a condition where the capacitance-to-ground of line conductor 12 exceeds that of line conductor 13 will now be considered. The unbalance current $I_{SEC}$ in the secondary winding 32 for this capacitive unbalance condition will have the waveform 206 shown in the FIG. 2 timing diagram. This capacitative unbalance current 206 leads the line potential $V_{12}$ by 90° ($\pi/2$ radians) in line-frequency phasing.

When $V_{44}$ is positive-valued, causing transistor 73b to withdraw collector current from the joined emitter electrodes of transistors 75 and 77, the positive portion of the signal applied between the base electrodes of transistors 75 and 77, will have substantially the same amplitude distribution over time as its negative portion. Therefore, the collector current demand of transistor 75 over the first half of a positive pulse of $V_{44}$ will be equal to the collector current demand of transistor 77 during the latter half of this pulse. The collector current demand of transistor 75 is applied to the input port of the current mirror amplifier 80, which responds to supply a similar-valued current from its output port to the terminal 48. The collector current demand of transistor 77 is coupled via a common-base amplifier transistor 79 to withdraw a similar-valued current from terminal 48. Insofar as the capacitor 24 is concerned, the charge accumulated in response to current supplied from current mirror amplifier 80 during the first half of the positive pulse of $V_{44}$, equals the charge supplied from capacitor 24 to satisfy the collector demands of transistor 79 during the second half of the positive pulse of $V_{44}$. Therefore, no net charge will be accumulated on the capacitor 24 during the half-cycles when $V_{44}$ is positive-valued.

On the following half-cycle, when $V_{45}$ is positive-valued, causing transistor 74b to withdraw a collector current from the joined emitter electrodes of transistors 76 and 78, the negative portion of the signal applied between the base electrodes will have substantially the same amplitude distribution over time as its positive portion. Therefore, the collector current demand of transistor 78 over the first half of a positive pulse of $V_{45}$ will be equal to the collector current demand of transistor 76 during the later half of this pulse. The collector current demand of transistor 78 is applied to the input port of the current mirror amplifier 80 which responds to supply a similar-valued current from its output port to the terminal 48. The collector current demand of the transistor 76 is coupled via common-base amplifier transistor 79 to withdraw a similar-valued current from terminal 48.

Insofar as the capacitance 24 is concerned, the charge accumulated in response to current supply from current mirror amplifier 80 during the first half of the positive pulse of $V_{45}$ equals the charge supplied from capacitor 24 to satisfy the collector current demand of transistor 79, during the second half of the positive pulse of $V_{45}$. Therefore, no net charge will be accumulated on the capacitor 24 during the half cycles when $V_{45}$ is positive-valued as well as during the alternative half cycles when $V_{44}$ is positive-valued. The potential developed across capacitor 24 by this alternate charging and discharging is arranged to be insufficiently large to forward bias the base-to-emitter junctions of the Darlington-connected transistors 113, 115 or 114, 116. Therefore, no positive current will be supplied from terminals 47 to trigger SCR 25 into conduction for the capacitive unbalance condition.

The response of the synchronous demodulator 70 to a condition where the capacitance to ground-to-ground of line conductor 15 exceeds that of line conductor 12 will be an output current equal in amplitude but opposite in polarity to that in waveform 207 of FIG. 2. For this condition, also, the recurrent charging and discharging of capacitor will not cause sufficient potential thereacross to foward-bias the Darlington-connected transistors 113, 115 or 114, 116.

In the current-sensitive threshold detector 100, PNP transistor 101 and NPN transistor 102 each have their base electrodes connected to terminal 49 to be biased at (1/2) B+ potential. Transistor 101 is biased for constant-emitter current operation by the constant current sink 103 and the current mirror amplifier 105, comprising diode 107 and transistor 109; and transistor 102 is biased for constant emitter current operation by the constant current soure 104 and the current mirror amplifier 106, comprising diode 108 and transistor 110. The emitter currents of transistors 101 and 102 are made equal, as may be done by making current mirror amplifiers 105 and 106 to have equal gains and using a common element such as a resistor connected between the base electrodes of transistors 109 and 110 to serve as both current sink 103 and current source 104. Considering transistor 101, by forcing its emitter current to be of a determinate value, its emitter electrode will be at a fixed $V_{BE}$ offset potential with regard to its base electrode; and, similarly, for transistor 102.

Diode 111 connects the collector electrode of transistor 101 to the terminal 48 at the input of the current sensitive threshold detector 100. Diode 112 connects the collector electrode of transistor 102 to terminal 48. When no current is supplied to or withdrawn from the interconnection of diodes 111 and 112 except for the currents flowing through these diodes themselves, diodes 111 and 112 are forward biased by collector current flow from transistor 101 to transistor 102 thereby to maintain a $2V_{BE}$ offset potential across themselves. Since the base electrodes of PNP transistor 101 and NPN transistor 102 are connected to the same potential, this $2V_{BE}$ potential tends to forward bias the collector-base junctions of both transistors 101 and 102.

This tendency is such as to cause one or the other of transistors 101 and 102 to operate in saturation, with its collector-base junction foward biased to refer its collector electrode to a potential only slightly removed from its emitter potential. If transistor 101 is in pronounced saturation, its collector electrode will be less positive than its emitter electrode by its collector-to-emitter saturation potential or $V_{SAT}$, which is usually quite well-defined at about 0.1 to 0.2 volts. Since, as noted above, its emitter potential is $1V_{BE}$ more positive than the (1/2) B+ potential at terminal 49, this places the collector electrode of transistor 101 at a positive potential ($V_{BE}V_{SAT}$) with respect to (1/2) B+ potential. The potential of the collector electrode of transistor 101 is also the potential at the anode of the diode 111, so the cathode of that diode, being $IV_{BE}$ less positive than its anode potential, is at a potential $V_{SAT}$ less positive than the potential at terminal 49. This means that there is insufficient potential between terminals 48 and 49 to forward bias serially-connected junctions of the Darlington-connected PNP transistors 114 and 116, much less to forward bias the serially-connected base-emitter junctions of the Darlington-connected NPN transistors 113 and 115.

Conversely, if transistor 102 is in pronounced saturated, its collector electrode will be more positive than its emitter electrode by its collector-to-emitter saturation potential or $V_{SAT}$, like that of transistor 101, is usually quite well-defined at about 0.1 or 0.2 volts. Since the emitter potential of transistor 102 is, as noted above, $1V_{BE}$ less positive than the (1/2) B+ potential at terminal 49, this places the collector electrode of transistor 102 at a negative potential ($V_{BE} - V_{SAT}$) with respect to (1/2) B+ potential. The potential at the collector electrode of transistor 102 is also the potential at the cathode of the diode 112, so the anode of that diode being $1V_{BE}$ more positive than its cathode potential is at a potential $V_{SAT}$ more positive than the (1/2) B+ potential at terminal 49. This potential is insufficient to forward bias the serially-connected junctions of transistors 113, 115 much less the serially-connected base-emitter junctions of transistors 114, 116.

In the unlikely event transistors 101 and 102 are both in or almost in saturation, absent current being applied to or withdrawn from terminal 48 except via diodes 111 and 112, the potential at terminal 48 will lie somewhere in the range of (1/2) B+ ± $V_{SAT}$, as defined by the two boundary conditions just described.

Suppose now a positive current is applied from the synchronous demodulator 70 to the circuit node to which terminal 48 is connected. This positive current will tend to place charge on capacitor 24 and so raise the potential at terminal 48. This increased positive potential at terminal 48 will guarantee that transistor 101 operates in its saturation mode and will make the back-to-back connection of the diode 111 and the collector-base junction of transistor 101 less conductive. This will force the constant emitter current of transistor 101 to flow to increased measure to its base electrode and in decreased measure to its collector electrode.

Slightly raising the potential at terminal 48 removes transistor 102 from saturation—if indeed it has been in saturation. Transistor 102 is biased in its normal operating mode, therefore, and will demand collector current substantially equal to the constant current withdrawn from its emitter electrode. The entire positive current supplied from the synchronous demodulator 70 will flow through diode 112 to the collector electrode of transistor 102 to meet this collector current demand unless and until this positive current exceeds the collector current demand of transistor 102.

When the positive current from the synchronous demodulator 70 exceeds the collector current demand of transistor 102, the excess current flows to charge the capacitor 24 further. This further charging raises the potential of terminal 48 with respect to the 1/2 B+ potential at terminal 49 so as to apply forward bias to the base-emitter junctions of Darlington-connected transistors 113 and 115, causing them to draw collector currents from the input port of a current mirror amplifier 117. (Current mirror amplifier 117 is shown as comprising diode 118 and transistor 119). The current mirror amplifier 117 responds to supply a positive current from its output port to terminal 47 of the detector module 40. This positive current triggers the SCR 25, which in turn, causes the relay 20 to interrupt current flow in line conductors 12 and 13.

Suppose, now, a negative current is applied from the synchronous demodulator 70 to the circuit node at terminal 48. This negative current will tend to place charge on capacitor 24 and so lower the potential at terminal 48. This decreased positive potential at terminal 48 will guarantee that transistor 102 operates in its saturation mode and will make the back-to-back connection of the diode 112 and the collector-base junction of transistor 102 less conductive. This will force the constant emitter current of transistor 102 to flow in increased measure to its base electrode and in decreased measure to its collector electrode. Slightly decreasing the positive potential at terminal 48 removes transistor 101 from saturation—if, indeed, it has been saturated. Transistor 101 is biased in its normal operating mode, therefore, and will supply a collector current substantially equal to the constant current withdrawn from its emitter electrode. The entire negative current supplied from the synchronous demodulator 70 is, in effect, a current demand and will be supplied by the collector current of transistor 101 flowing through diode 111 unless and until this demand exceeds the capability of transistor 101 is to supply collector current. This capability of transistor 101 is to supply collector current to meet the demand of the synchronous demodulator 70 is limited to a current level substantially equal to the constant current supplies to its emitter electrode.

When the current demand of the synchronous demodulator 70 exceed the capability of transistor 101 to supply collector current the excess current requirement must be supplied by the capacitor 24. Supplying this excess current demand charges the capacitor 25 to make the potential at terminal 48 increasingly negative with respect to the potential at terminal 49. This applies forward bias to the base-emitter junctions of Darlington connected transistors 114 and 116, causing them to supply positive collector currents to terminal 47 of the detector module 40. The positive current from terminal 47 triggers the SCR 25, which, in turn, causes the relay 20 to interrupt current flow in line conductors 12 and 13.

The use of a current-sensitive threshold detector 100 responsive to synchronously detected unbalance currents of either positive or negative polarity offers the advantage that the connections of secondary winding 32 between terminals 42 and 43, can be interchanged by mistake or by reason of ignoring the polarity of connection, without altering the response of the ground-fault detector module 40. However, current-sensitive threshold detectors only responsive to synchronously detected unbalance currents of one polarity can replace detector 100 without loss of operation, provided care is taken concerning the polarity of connection of winding 32.

The charging of capacitor 24 cannot proceed, as has been noted, until the synchronous demodulator 70:

a. provides a negative output current which exceeds the threshold current level absorbed as collector current by transistor 101; or b., alternatively, provides a positive output current which exceeds the threshold current level absorbed as collector current by transistor 102. This means that a certain amount of internally generated noise in the transistors of amplifiers 50 and 60 and of synchronous demodulator 70 will not cause response from detector 100. Also, electrical "hash" appearing on the power line conductors 11, 12, 13 will not be responded to by detector 100. But, more importantly, small quiescent direct current output, resulting from the sychronous demodulator 70 being imperfectly balanced for $I_{SEC} = 0$ conditions, will not cause detector 100 to respond. Perfect balance of synchronous demodulator 70 for $I_{SEC} =$ 0 conditions is difficult to achieve during the brief internal during average-axis crossings of the line potentials when the B+ supply potential on bus 123 collapses because $V_{44}$ and $V_{45}$ pulses do not overlap. Only after the one or the other of the threshold input currents has been exceeded will the charging of capacitor 24 begin and continue until the threshold potential required to bias Darlington-connected transistors 112, 115 or 114, 116 into conduction is obtained.

FIG. 3 shows a ground-fault interrupter system 10', similar to system 10 of FIG. 1, but designed for use with a pair of single-phase a-c line conductors 12, 13. The systems 10' may be operated with conductors 12, 13 either balanced-to-ground, as shown, or single-ended to ground. The system 10 uses a ground fault detector module 40', which, except for external capacitor 24 and a threshold level potentiometer 140, can be made in monolithic integrated circuit form.

Amplifier 50' is similar to amplifier 50 except for avalanche diode 59 being replaced by serially-connected forward-biased diodes 591, 592, 593, 594. Amplifier 60' is similar to amplifier 60 except for avalanche diode 69 being replaced by serially-connected forward-biased diodes 691, 692, 693, 694. Replacing the avalanche diodes with forward-biased diode chains increases the voltage gain of these amplifiers and thus increases the sensitivity obtainable from the ground-fault detector.

Synchronous demodulator 70' is a single-balanced synchronous detector, rather than a doubly-balanced synchronous demodulator 70 as shown in FIG. 1. Transistors 75 and 77 are replaced by transistors 751 and 771 which have transistors 752 and 772, respectively, in cascode connection with them. Single-balanced synchronous demodulators can be used in ground-fault detectors for 3-wire, ground neutral systems also. In the FIG. 1 system 10, this could have been done by modifying module 40 to eliminate elements 72, 74, 76, 78, for instance.

Current mirror amplifier 80' resembles current mirror amplifier 80 of FIG. 1 except that equal resistance resistors 81' and 83' replace, respectively, a serial connection of diodes 81, 82 and a serial connection of diodes 83, 84.

Operating power is applied to the ground fault detector module 40' when the potential on line conductor 11 is positive with respect to that on line conductor 12. The operating potential on the positive supply bus 123 of the module 40 is constrained to the sum of the potential offsets of avalanche diodes 35a and 35b. These avalanche diodes typically exhibit breakdown potentials of 6 volts or so.

A potential half that appearing across the series connection of avalanche diodes 35a and 35b appears at their interconnections, so the function of the potential divider circuit 130 can be subsumed by avalanche diodes 35a and 35b. When the potential on line conductor 11 is negative with respect to that on line conductor 12, a junction 33' becomes conductive to clamp bus 123 to a potential not much more negative than local ground. When module 40' is constructed in monolithic integrated circuit form, junction 33' is provided between the substrate and forward-biased collector isolation boats.

Rheostat 140 is a threshold sensitivity control used to determine what level of $I_{SEC}$ current from secondary winding 32 will be required in order that the presence of a ground fault will be detected. Rheostat 140 is connected in series with diode 107 between bus 123 and local ground to determine the current bled through diode 144 in response to pulses of $V_{44}$ appearing on bus 123. This series connection is made via terminal 141. The potential appearing across diode 107 during pulses $V_{44}$ is applied to the base-emitter circuits of transistors 109 and 143, which are similar, and to the base-emitter circuit of transistor 144, which supplies its collector current as operating current to differential amplifier 85. The collector current of transistor 143, which is the same value as the collector current of transistor 109, is coupled via a common-base amplifier transistor 145 to a current mirror amplifier 146.

Common-base amplifier transistors 145 and 101 have substantially the same unity current gains; so, since their emitter currents are alike, so are their collector currents. (Offset diodes may be connected between the collector electrode of transistor 145 and 147 to better match the collector potentials and thus the current gains of common-base amplifier transistors 101 and 145.) Current mirror amplifier 146, comprising transistors 147, 148, 149 withdraws an emitter current from transistor 102 substantially equal to the collector current of transistor 145. As noted before, the collector currents of transistors 101 and 145 are substantially equal. NPN transistor 102 has nearly unity common-base amplifier gain. The collector currents of transistors 101 and 102 will be closely matched despite PNP transistors, in this circuitry, having relatively low common-emitter forward current gains as compared to the NPN transistors.

Reducing the resistance of the rheostat 140 increases the collector currents of transistors 101 and 102 and increases the level of the synchronously detected unbalance current required to begin charging of capacitor 24. Increasing the resistance of rheostat 140 on the other hand, will reduce the level of synchronously detected unbalance current required to begin charging of capacitor 24 and thus will increase the sensitivity of the ground fault detector module 40' in detecting ground faults.

The ground-fault detector modules 40 and 40' of FIGS. 1 and 3, respectively, have been described as components of ground-fault interrupter systems. The modules 40 and 40' may, also or alternatively, be used to actuate indicators to signal the ground-fault condition to a human being. The neon bulb 28 in FIG. 1 and the incandescent bult 28' in FIG. 1 are examples of such indicators. Each lights up when the relay coil 23 is energized.

I claim:

1. A current-responsive threshold detector comprising:

an input terminal for accepting input current;
a reference voltage node;
means for applying a first current to said input terminal;
means for applying a second current to said input terminal that is of opposite polarity to said first current and of sufficient amplitude to counteract such of said first current as is not counteracted by an input current, said means including
a first transistor having base and emitter electrodes with a base-emitter junction therebetween and having a collector electrode,
means connecting said first transistor base electrode to said reference voltage node,
means for applying a forward bias current to the base-emitter junction of said first transistor, and a first semiconductor rectifier element connected between said first transistor collector electrode and said input terminal and poled for conducting the normal collector current of said first transistor, which collector current corresponds to said second current;

impedance means connecting said input terminal to said reference voltage node for developing a potential thereacross responsive to input current exceeding the value required to completely counteract said first current; and a voltage-responsive threshold detector connected to be responsive to the potential across said impedance means responsive to input current exceeding the value to completely counteract said current.

2. A current-responsive threshold detector as claimed in claim 1 wherein said impedance means includes a capacitive element to reduce the effective of switching transients upon the responsive of said voltage-responsive threshold detector means.

3. A current-responsive threshold detector as claimed in claim 1 wherein said means for applying forward bias current to the base-emitter junction of the first transistor comprises:
   a second transistor of the same conductivity type as said first transistor, having an output electrode connected to said first transistor electrode, and having input and common electrodes; and
   further means for connecting said first and said second transistors in cascade relationship with each other including a source of biasing potential applied between the input and common electrodes of said second transistor.

4. A current-responsive threshold detector as set forth in claim 1 wherein said voltage-responsive threshold detector comprises:
   a second transistor of complementary conductivity type to said first transistor having an input electrode connected to said input terminal, having a common electrode connected to said reference voltage node, and having an output electrode connected for providing a current indicative of the potential between its input and common electrodes exceeding a predetermined valve and
   means for applying a quiescent biasing potential between the common and the output electrodes of said second transistor.

5. A current responsive threshold detector as set forth in claim 1 wherein said means for applying a first current to said input terminal includes:
   a second transistor of complementary conductivity type to said first transistor having base and emitter electrodes with a base-emitter junction therebetween and having a collector electrode, said second transistor base electrode being connected to said reference voltage node;
   means for appling a forward bias current to the base-emitter junction of said second transistor, and
   a second semiconductor rectifier element connected between said second transistor collector electrode and said input terminal and poled for conducting the normal collector current of said second transistor, which collector current corresponds to said first current.

6. A current-responsive threshold detector as set forth in claim 5 wherein said voltage-responsive threshold detector comprises:

a third and fourth transistors of the same conductivity types respectively as said second and said first transistors, each having an input electrode connected to said input terminal, and each having a common electrode connected to said reference voltage node, and each having an output electrode connected for providing an output current indicative of the potential between its input and common electrodes exceeding a predetermined value; and means for constructively combining the output currents of said third and said forth transistors.

7. A current-responsive threshold detector as claimed in claim 6 wherein said means for constructively combining the output currents of said third and said fourth transistors includes an amplifier with inverting current gain having an input circuit connected to receive said output current of said third transistor and an output circuit coupled to an output terminal to which said fourth transistor collector electrode is also coupled.

8. A current-responsive threshold detector as set forth in claim 6 in combination with:
   fifth and sixth transistors being of similar conductivity type, having respective input electrodes arranged to receive an input signal applied therebetween, having respective common terminals, and having respective output terminals;
   a current mirror amplifier having an input circuit between input and common terminals and an output circuit between an output terminal and said common terminal;
   a supply of operating current; and
   means connecting said fifth and said sixth transistors together with said current mirror amplifier in differential amplifier configuration including said supply of operating current connected between said current mirror amplifier common terminal and an interconnection between the common electrodes of said fifth and said sixth transistors, said fifth transistor collector electrode being directed coupled to said current mirror amplifier input terminal, said sixth transistor collector electrode being direct coupled to said current mirror amplifier output terminal, and said current mirror amplifier output being connected to said input terminal of said current-responsive threshold detector.

9. A current responsive threshold detector comprising:
   an input terminal for accepting input current;
   current source means for supplying current to said input terminal, including
   a first transistor of PNP conductivity type having base and emitter electrodes and a base-emitter junction therebetween and having a collector electrode,
   means for applying a forward-bias current of a predetermined value to the base-emitter junction of said first transistor,
   and a first semiconductor rectifier element connected between said first transistor collector electrode and said input terminal and poled for conducting the normal collector current flow of said first transistor;
   current sink means for withdrawing current from said input terminal, including
   a second transistor of NPN conductivity type having base and emitter electrodes and a base-emitter junction therebetween and having a collector electrode,
   means for applying a forward-bias current to the base-emitter junction of said second transistor, and a second semiconductor rectifier element connected between said second transistor electrode and said input terminal and poled for conducting the normal collector current flow of said second transistor;

means applying a reference voltage to each of the base electrodes of said first and said second transistors, a capacitor having first and second plates respectively connected to said input terminal and to a point of fixed potential with respect to said reference voltage; and a voltage-responsive theshold detector connected to be responsive to the potential appearing at said input terminal with respect to said reference voltage.

* * * * *

UNITED STATES PATENT OFFICE
CERTIFICATE OF CORRECTION

PATENT NO. : 4,037,155
DATED : July 19, 1977
INVENTOR(S) : Adel Abdel Aziz Ahmed It is certified that error appears in the above-identified patent and that said Letters Patent are hereby corrected as shown below:

Col 7, line 7, "!2" should be --12--.

Col 7, line 15, "61a" should be --61b--.

Col 10, line 3, "15" should be --12--, and "12" should read --13--.

Col 10, line 60, "$IV_{BE}$" should be --$1V_{BE}$--.

Col 11, lines 1-2, "saturated" should be --saturation--.

Col 11, line 35, "flow to" should be --flow in--.

Col 12, line 18, cancel "is".

Col 12, line 24, "exceed" should be --exceeds--.

Col 12, line 27, "25" should be --24--.

Col 13, line 9, "112" should be --113--.

Col 13, line 14, "systems" should be --system--.

Col 13, line 55, "interconnections" should be --interconnection--.

Col 14, line 47, "bult" should be --bulb--.

Col 15, line 18, "effective" should be --effect--.

Col 15, line 19, "responsive" should be --response--.

Col 15, line 27, after "transistor" insert --emitter--.

UNITED STATES PATENT OFFICE
CERTIFICATE OF CORRECTION

PATENT NO. : 4,037,155
DATED : July 19, 1977
INVENTOR(S) : Adel Abdel Aziz Ahmed It is certified that error appears in the above-identified patent and that said Letters Patent are hereby corrected as shown below:

Col 15, line 45, "valve" should be --value--.
Col 16, line 1, cancel "a".
Col 16, line 39, "directed" should be --direct--.
Col 17, line 2, after "transistor" insert --collector--.

Signed and Sealed this

Eighteenth Day of July 1978

[SEAL]

Attest:

RUTH C. MASON
Attesting Officer

DONALD W. BANNER
Commissioner of Patents and Trademarks